United States Patent
Shimoyama

(10) Patent No.: US 7,330,394 B2
(45) Date of Patent: Feb. 12, 2008

(54) INFORMATION STORAGE DEVICE, INFORMATION STORAGE METHOD, AND INFORMATION STORAGE PROGRAM

(75) Inventor: Takeshi Shimoyama, Tokyo (JP)

(73) Assignee: Sony Corporation, Tokyo (JP)

( * ) Notice: Subject to any disclaimer, the term of this patent is extended or adjusted under 35 U.S.C. 154(b) by 71 days.

(21) Appl. No.: 10/534,752

(22) PCT Filed: Oct. 29, 2003

(86) PCT No.: PCT/JP03/13832

§ 371 (c)(1),
(2), (4) Date: May 13, 2005

(87) PCT Pub. No.: WO2004/047114

PCT Pub. Date: Jun. 3, 2004

(65) Prior Publication Data

US 2006/0028883 A1  Feb. 9, 2006

(30) Foreign Application Priority Data

Nov. 20, 2002  (JP) ............................. 2002-336834

(51) Int. Cl.
*G11C 8/00* (2006.01)
(52) U.S. Cl. .................. 365/233; 365/205; 365/189.05
(58) Field of Classification Search ................ 365/233, 365/205, 189.05
See application file for complete search history.

(56) References Cited

U.S. PATENT DOCUMENTS

| | | | |
|---|---|---|---|
| 5,896,347 A * | 4/1999 | Tomita et al. | ............... 365/233 |
| 6,011,728 A | 1/2000 | Akeyama | |
| 6,229,752 B1 | 5/2001 | Ayukawa et al. | |
| 6,438,055 B1 | 8/2002 | Taguchi et al. | |

FOREIGN PATENT DOCUMENTS

| | | |
|---|---|---|
| JP | 7-57457 | 3/1995 |
| JP | 7-211062 | 8/1995 |
| JP | 8-255107 | 10/1996 |
| JP | 10-125062 | 5/1998 |
| JP | 10-134572 | 5/1998 |
| JP | 2000-293983 | 10/2000 |
| JP | 2001-118383 | 4/2001 |
| JP | 2001-135080 | 5/2001 |
| JP | 2001-143466 | 5/2001 |
| JP | 2001-229674 | 8/2001 |
| JP | 2002-15575 | 1/2002 |
| JP | 2002-208274 | 7/2002 |

* cited by examiner

*Primary Examiner*—Huan Hoang
(74) *Attorney, Agent, or Firm*—Oblon, Spivak, McClelland, Maier & Neustadt, P.C.

(57) ABSTRACT

Disclosed is a synchronous information storage device that uses a synchronizing clock signal to exercise operation timing control and processes operations with high efficiency to improve performance and provide low power consumption, which is characteristic of DRAMs. The information storage device includes a plurality of memory cells for storing data by accumulating an electrical charge and an amplifier for amplifying the electrical charge of the memory cells, and uses a synchronizing clock signal for input/output timing of the data. An electrical charge removal operation for moving an electrical charge from the memory cells to the amplifier or an electrical charge accumulation operation for acquiring an electrical charge from the amplifier and accumulating the electrical charge in the memory cells and an input/output operation for the amplifier in relation to the outside of the information storage device are processed while using a single clock of the synchronizing clock signal for synchronization timing.

16 Claims, 8 Drawing Sheets

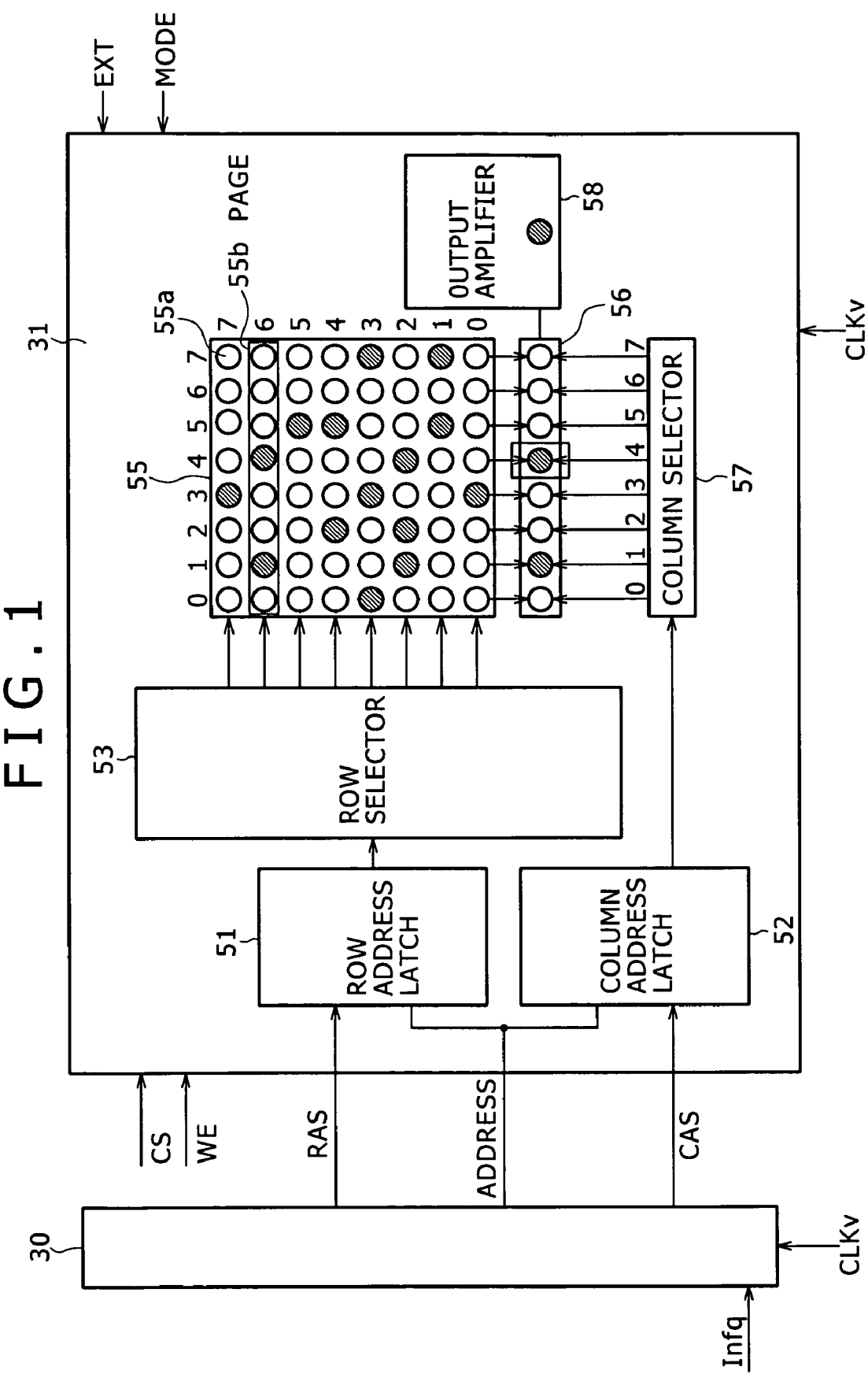

FIG. 2

TYPICAL RELATIONSHIP BETWEEN SIGNALS AND COMMANDS

| COMMAND | OPERATION | CS | RAS | CAS | WE | EXT | MODE | ROW ADDRESS | BANK | COLUMN ADDRESS |
|---|---|---|---|---|---|---|---|---|---|---|
| DESL | NO-OPERATION | H | X | X | X | X | X | X | X | X |
| NOP | NO-INSTRUCTION | L | H | H | H | H | X | X | X | X |
| READ | READ | L | H | L | H | H | X | X | V | V |
| WRITE | WRITE | L | H | L | L | H | X | X | V | V |
| ACT | ACTIVATE | L | L | H | H | H | X | V | V | X |
| PRE | PRECHARGE | L | L | H | L | H | X | V | V | X |
| PALL | ALL-BANK PRECHARGE | L | L | H | L | H | X | X | X | X |
| REF | REFRESH | L | L | L | H | H | X | X | X | X |
| MRS | MODE SET | L | L | L | L | X | X | * | * | * |
| BST | BURST STOP | L | H | X | H | L | X | X | X | X |
| P+A+R | PRE+ACT+READ | L | X | X | L | L | L | V | V+ | V |
| P+A+W | PRE+ACT+WRITE | L | X | X | L | L | L | V | V+ | V |
| A+R | ACT+READ | L | X | X | H | L | H | V | V+ | V |
| A+W | ACT+WRITE | L | X | X | L | L | H | V | V+ | V |

EXTENDED COMPLEX OPERATIONS: { P+A+R, P+A+W, A+R, A+W }

| SYMBOL | MEANING |
|---|---|
| L | 0 |
| H | 1 |
| X | ARBITRARY |
| V | VALID (V+ MAY REQUIRE TWO TIMES AMOUNT OF INFORMATION.) |
| * | PARTIALLY VALID |

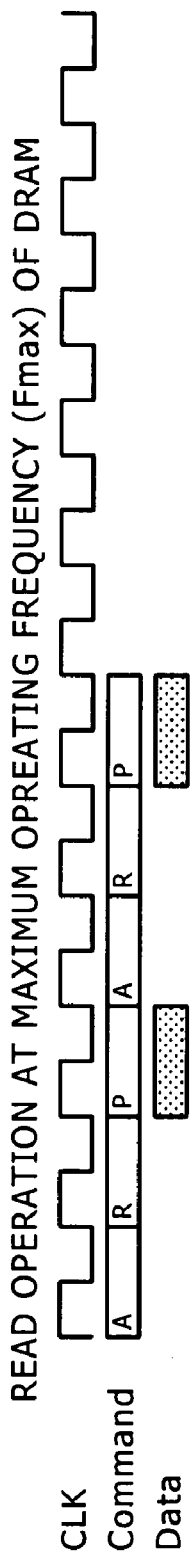
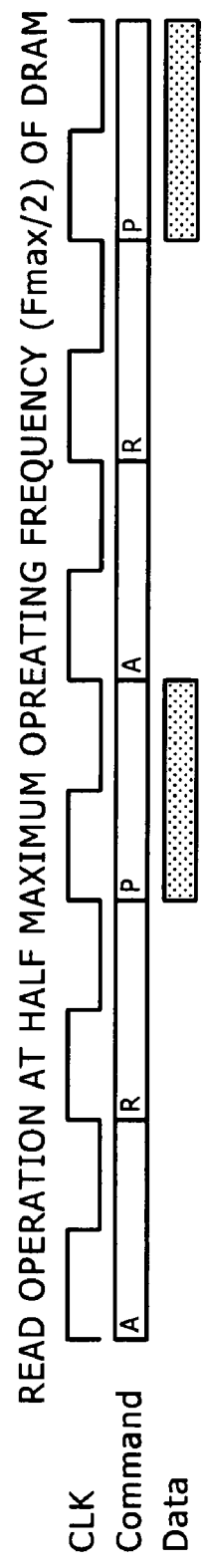
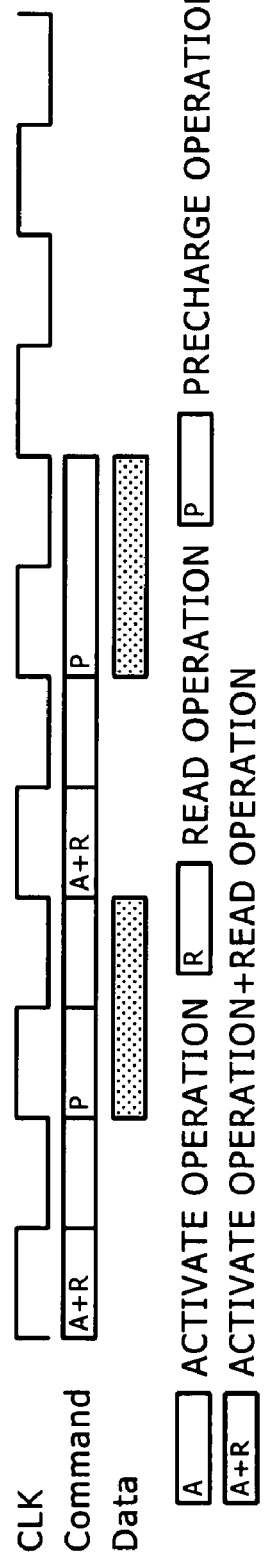

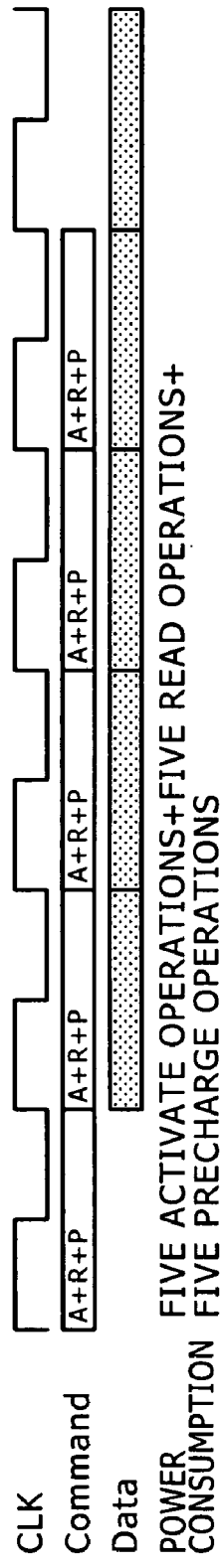
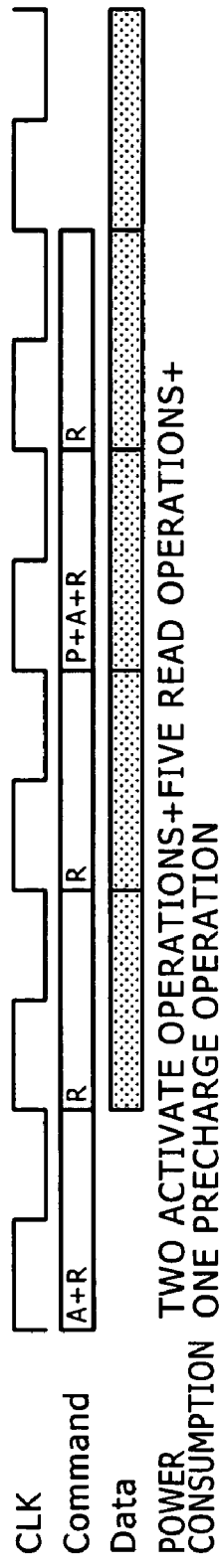

ously used, asynchronous DRAM, has been increas-
INFORMATION STORAGE DEVICE, INFORMATION STORAGE METHOD, AND INFORMATION STORAGE PROGRAM This application is a 371 of PCT/JP03/13832 filed on Oct. 29, 2003.

TECHNICAL FIELD

The present invention relates to an information storage device that stores data by accumulating an electrical charge, and more particularly to a synchronous information storage device that achieves synchronization with a clock signal.

BACKGROUND ART

A DRAM (Dynamic Random Access Memory) is widely used as an information storage device that serves as a main memory for a personal computer or like system. Among others, an SDRAM (Synchronous Dynamic Random Access Memory or Synchronous DRAM), which is faster than a previously used, asynchronous DRAM, has been increasingly used. The SDRAM is a memory device that synchronizes its operation with a base clock frequency. Timing recognition is properly accomplished because it is in synchronism with a clock signal. Due to such timing recognition, the SDRAM operates rapidly. The SDRAM can transmit data with high efficiency particularly in a situation where data is continuously output in synchronism with a system clock (e.g., burst transfer).

The operation of the SDRAM will now be described. Within a single clock, an activate operation, read or write operation, precharge operation, and other operations are used for data handling. These operations are designated by a command from a memory controller or other external device. Basic operations will now be outlined. The activate operation is performed to acquire memory cell data by amplifying it with a sense amplifier. The read operation is performed to output the data existing in the sense amplifier via an output buffer. The write operation is performed to deliver the data in an I/O line to the sense amplifier. The precharge operation is performed to write the data existing in the sense amplifier back into a memory cell.

A known technology of synchronous semiconductor storage device is disclosed, for instance, by Japanese Patent Laid-open No. 2002-074953 reduces the current consumption by activating an input buffer circuit on a necessary operating cycle only without impairing an input buffer's rapid response.

In general, a conventional SDRAM is designed to perform an activate operation, read or write operation, or precharge operation within a single clock. A common SDRAM is limited in terms of time for operation assurance. Further, latency and real-time limitations are imposed on command issuance. The latency is limited without regard to the synchronizing clock frequency. A typical latency is a CAS latency, which denotes the number of clocks required for the interval between the instant at which a read command is issued and the instant at which data is output. On the other hand, the real-time limitations are generally related, for instance, to a Tras (RAS activate time) parameter, which represents the time between an activate operation and precharge operation, a Trcd (RAS-CAS delay time) parameter, which represents the time between an activate operation and read operation, and Trp (precharge time) parameter, which represents the time between a precharge operation and activate operation. Command issuance needs to be performed after a wait of at least the above-mentioned time. If a command is issued without such a wait, the operation is not guaranteed.

When the operating frequency is decreased so that the clock period is longer than the aforementioned real-time limit, which is one of the time limitations on the SDRAM, the command issue timing is determined for each cycle. Therefore, even if a command can be issued on each clock, most of the clock period is vacant and unnecessary for operations. As a result, the performance of the SDRAM deteriorates.

Further, as an example of an SDRAM, one known DRAM simultaneously performs an activate operation, read or write operation, and precharge operation like an SRAM (Static Random Access Memory). This type of DRAM is at an advantage in that a DRAM controller does not have to exercise page management. However, a precharge operation is performed on every clock. Therefore, the power consumption is not low although the common DRAM features low power consumption.

The present invention has been made in view of the above technical circumstances, and provides an information storage device and information storage method for exercising a synchronous information storage device function for controlling the operation timing with a synchronizing clock signal, performing a highly efficient operation process to provide improved performance, and assures low power consumption, which is peculiar to DRAMs.

DISCLOSURE OF INVENTION

In solving the above technical problems, according to one aspect of the present invention, an information storage device includes a plurality of memory cells for storing data by accumulating an electrical charge and an amplifier for amplifying the electrical charge of the memory cells, and uses a synchronizing clock signal for input/output timing of the data. An electrical charge removal operation for moving an electrical charge from the memory cells to the amplifier or an electrical charge accumulation operation for acquiring an electrical charge from the amplifier and accumulating the electrical charge in the memory cells and an input/output operation for the amplifier in relation to the outside of the information storage device are processed while using a single clock of the synchronizing clock signal for synchronization timing.

In the information storage device in which the synchronizing clock is used for data input/output timing, it may be possible to perform the above two operations within a single clock period if the synchronizing clock is shifted toward the low-frequency region. Therefore, a highly efficient data process can be performed when a command for performing the two operations is newly set to process the two operations while using the single clock of the synchronizing clock signal for synchronization timing. Even when a plurality of operations is performed, three basic operations are not performed on every clock. Therefore, the operations can be partly omitted to reduce the power consumption.

According to another aspect of the present invention, an information storage device includes a plurality of memory cells for storing data by accumulating an electrical charge, an amplifier for amplifying the electrical charge of the memory cells, and a comparator for comparing a requested memory cell address against the data temporarily retained in the amplifier. If the requested memory cell address does not agree with the address of the data in the amplifier, instructions are issued for sequentially processing an electrical charge accumulation operation for acquiring an electrical charge from the amplifier and accumulating the electrical charge in the memory cells, an input/output operation for the amplifier in relation to the outside of the information storage device, and an electrical charge removal operation for moving an electrical charge from the memory cells to the amplifier in order named while using a single clock for synchronization timing.

When a request signal is received, the above information storage device compares the memory cell address of the request signal against the address of data temporarily retained in the amplifier at the time of request signal reception. Therefore, when, for instance, data is to be successively output from the same address, the data can be output at a high speed. As a result, the performance of the information storage device is improved.

According to another aspect of the present invention, an information storage device includes a plurality of memory cells for storing data by accumulating an electrical charge, an amplifier for amplifying the electrical charge of the memory cells, and a comparator for comparing a requested memory cell address against the data in the amplifier, and performs, on every single clock of a synchronizing clock signal, an electrical charge removal operation for moving an electrical charge from the memory cells to the amplifier, an electrical charge accumulation operation for acquiring an electrical charge from the amplifier and accumulating the electrical charge in the memory cells, and an input/output operation for the amplifier in relation to the outside of the information storage device. When the requested memory cell address agrees with the address of the data in the amplifier, instructions are issued for sequentially processing an electrical charge accumulation operation for acquiring an electrical charge from the amplifier and accumulating the electrical charge in the memory cells, an input/output operation for the amplifier in relation to the outside of the information storage device, and an electrical charge removal operation for moving an electrical charge from the memory cells to the amplifier in order named while using a single clock of the synchronizing clock signal for synchronization timing.

When a request signal is received, the above information storage device compares the memory cell address of the request signal against the address of data temporarily retained in the amplifier at the time of request signal reception. Therefore, when, for instance, data is to be successively output from the same address, the data can be output at a high speed. As a result, the performance of the information storage device is improved.

According to still another aspect of the present invention, an information storage method includes the steps of comparing, when a request signal is received, the memory cell address designated by the request signal against the address of data temporarily retained in the amplifier and selectively performing, in accordance with the comparison result, an electrical charge removal operation for moving an electrical charge from the memory cells to the amplifier, an electrical charge accumulation operation for acquiring an electrical charge from the amplifier and accumulating the electrical charge in the memory cells, and an input/output operation for the amplifier in relation to the outside of the information storage device.

The information storage method according to the present invention makes an address comparison. Therefore, it is possible to select the operations that can be simultaneously processed within the same clock. The optimum operations are selected in accordance with the address comparison result. The selected operations can be simultaneously processed within the same clock so that a high processing speed is attained.

BRIEF DESCRIPTION OF THE DRAWINGS

FIG. 1 is a block diagram illustrating a typical SDRAM and memory controller according to one embodiment of the present invention.

FIG. 2 is a table illustrating a typical relationship between signals and commands for use in an SDRAM according to one embodiment of the present invention.

FIGS. 3A to 3C are timing diagrams illustrating a high-speed operation of an SDRAM according to one embodiment of the present invention with reference to different DRAM read operations. FIG. 3A is a read operation timing diagram that is obtained at the maximum operating frequency (Fmax) of a DRAM. FIG. 3B is a read operation timing diagram that is obtained at half the maximum operating frequency (Fmax/2) of the DRAM. FIG. 3C is a read operation timing diagram that is obtained when an extended complex operation is performed by the SDRAM according to one embodiment of the present invention.

FIGS. 4A and 4B are timing diagrams illustrating the low power consumption characteristic of an SDRAM according to one embodiment of the present invention with reference to different DRAM read operations. FIG. 4A is a read operation timing diagram that is obtained at the maximum operating frequency (Fmax) of a DRAM. FIG. 4B is a read operation timing diagram that is obtained when an extended complex operation is performed by the SDRAM according to one embodiment of the present invention.

BEST MODE FOR CARRYING OUT THE INVENTION

Figure 5:
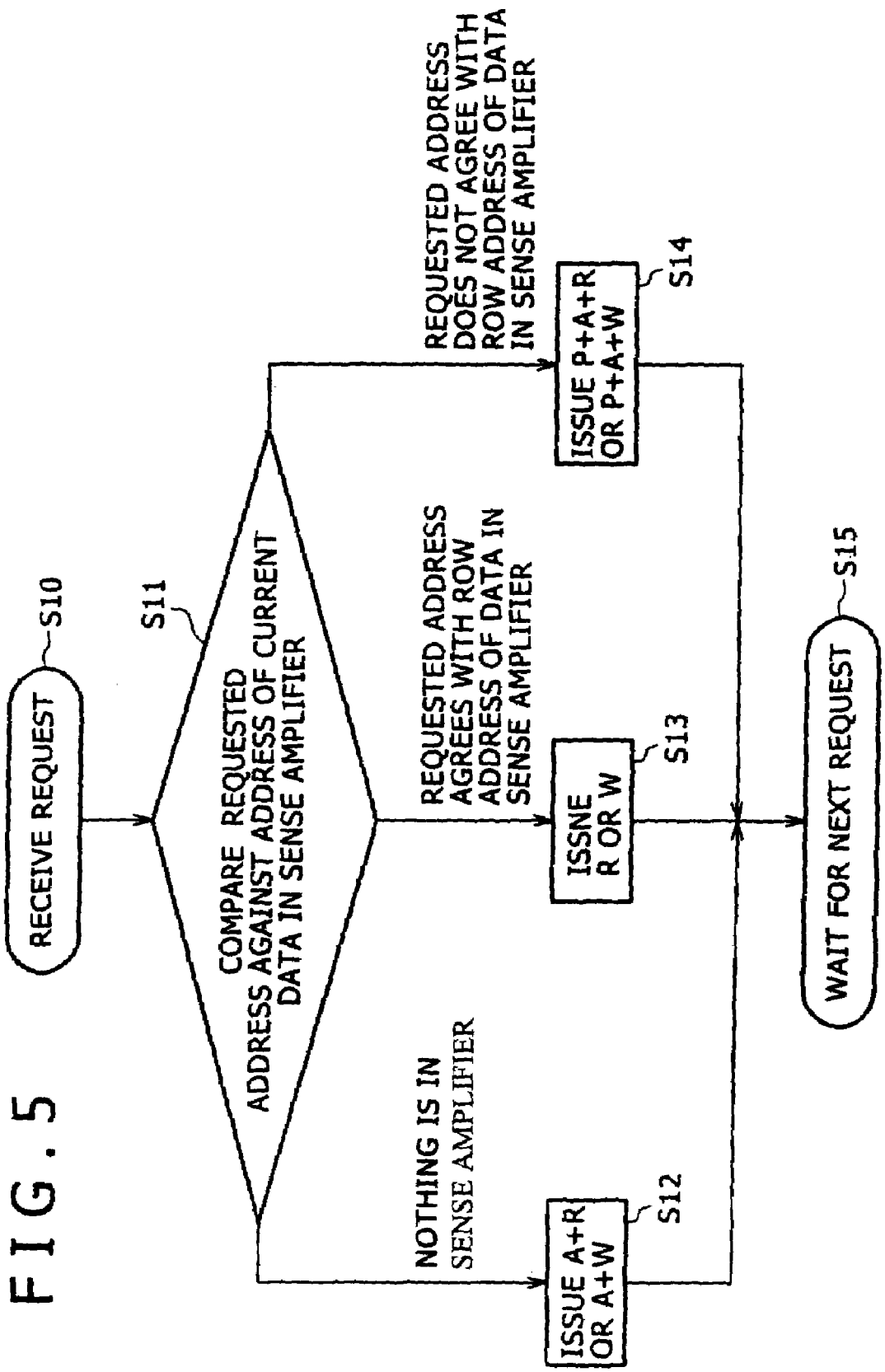
FIG. 5 is a flowchart illustrating an operation that is performed by an SDRAM according to one embodiment of the present invention.

An SDRAM (Synchronous Dynamic Random Access Memory or Synchronous DRAM) will now be described with reference to the accompanying drawings as one embodiment of an information storage device according to the present invention.

FIG. 1 is a block diagram illustrating a memory unit 31 according to the present embodiment and a memory controller 30, which is provided to transmit a control signal to the memory unit 31. The memory unit 31 is constructed as an SDRAM so that a variable clock signal CLKv is supplied from a required frequency control section.

The memory controller 30 is a device that outputs control signals to control the operation of the memory unit 31, which is a DRAM. The present embodiment outputs not only an address signal and various control signals such as CS (chip select), RAS (row address strobe), CAS (column address strobe), WE (write enable), CKE (clock enable), BA (bank), column address, and row address, but also an EXT (extension) signal and MODE signal. These control signals enter the memory unit 31. The relationship between these signals and commands will be later described with reference to FIG. 2. The frequency information Infq about the variable clock frequency CLKv is supplied from a frequency control section and CPU (not shown) to the memory controller 30 so that control can be exercised in accordance with the frequency information Infq.

The memory unit 31 includes a memory bank 55, a sense amplifier 56 for amplifying the electrical charge of each cell, and peripheral circuits. The memory bank 55 is a circuit for storing data. It includes a plurality of cells 55a. Each cell 55a is structured like a capacitor. In accordance with the data, each cell 55a is either charged or uncharged. The data is stored in accordance with the charge status pattern of each cell 55a. In the present embodiment, a single memory bank 55 has 8×8 cells 55a. However, the number of cells 55a may be other than 8×8.

A group of cells 55a in each row of the memory bank 55 is called a page 55b. When a refresh signal is entered from a refresh timing generator in a refresh control circuit or when a read signal is entered from a row selector 53, the memory bank 55 transfers the electrical charge of each cell 55a to the sense amplifier 56 in the unit of a page 55b that corresponds to a row into which the signal is entered. In FIG. 1, the numbers (0 to 7) marked in the vertical/horizontal direction of the memory bank 55 represent the row numbers for indicating the vertical position of each cell 55a in the memory bank 55 or the column numbers for indicating the horizontal position of each cell 55a in the memory bank 55.

When the data in the cells 55a of the page 55b specified by the row selector 53 is transferred, the sense amplifier 56 can receive the transferred data, amplify the data to a predetermined potential, and transfer the data back to the original page 55b. If, in this instance, a read signal for the data in the column specified by a column selector 57 is entered while an electrical charge is accumulated, the sense amplifier 56 reads the data in the specified column and outputs the data to an output amplifier 58.

In FIG. 1, the sense amplifier 56 is configured so that only the electrical charge for one page 55b of cells 55a can be amplified. Therefore, either a refresh process or a read process can be performed on one page only. Consequently, a refresh signal, which is generated by a self-refresh timing generator, or a read signal, which is generated by the row selector 53, is controlled by the CPU so that the signal is generated to provide timing for process execution on any row. A plurality of sense amplifiers 56 may be furnished so that the refresh process or read process can be simultaneously performed on a plurality of pages (rows).

Upon receipt of a CAS signal, which is input from the memory controller 30, a column address latch 52 turns ON its operation state and outputs the information about a column at an address indicating the position of a cell 55a in the memory bank 55 to the column selector 57. The column selector 57 outputs the read signal for the sense amplifier data corresponding to a column input from the column address latch 52 to the sense amplifier 56. The read signal output in this manner is read by the output amplifier 58. The output amplifier 58 amplifies the input electrical charge and outputs data to the CPU via the memory controller 30.

The operation that the memory controller 30 performs to read data in a cell 55a of the memory bank 55 upon instructions from the CPU will now be described. When, for instance, the memory controller 30 attempts to read data in a cell 55a in the sixth row, fourth column of a DRAM memory bank 55 upon instructions from the CPU, the CPU instructs the memory controller 30 to read the data in a cell 55a in the sixth row, fourth column. Upon receipt of such instructions, a control signal generation section of the memory controller 30 outputs a RAS signal to a row address latch 51 and then outputs the associated address signal to the row address latch 51 and column address latch 52. Upon receipt of the RAS signal from the control signal generation section, the row address latch 51 turns ON its operation, and outputs the row information of subsequently received address information to the row selector 53. Therefore, the SDRAM according to the present embodiment outputs the information named "sixth row" to the row selector 53.

In accordance with the information about a row, which is input from the row address latch 51, the row selector 53 outputs a read signal for transferring the electrical charge in the cells 55a within a page 55b corresponding to the row to the sense amplifier 56. In the SDRAM according to the present embodiment, the electrical charge in the cells 55a within a page 55b in the sixth row, which is enclosed by a solid line in the drawing of the memory bank 55, is then output to the sense amplifier 56. The sense amplifier 56 amplifies the amount of the transferred electrical charge to a predetermined value. The operation performed to read the information about a cell 55a and let the sense amplifier 56 amplify the read information is referred to as an activate operation.

In the above instance, the control signal generation section not only outputs a CAS signal to the column address latch 52, but also outputs an address signal to the row address latch 51 and column address latch 52. Upon receipt of the CAS signal from the control signal generation section, the column address latch 52 turns ON its operation, and outputs the column information of subsequently received address information to the column selector 57. Therefore, the SDRAM according to the present embodiment outputs the information named "fourth column" to the column selector 57.

In accordance with the input information about a column, the column selector 57 outputs to the output amplifier 58 a read signal for transferring the electrical charge that is amplified by the sense amplifier 56 and in correspondence with the column. In the SDRAM according to the present embodiment, the sense amplifier 56 outputs the electrical charge in a cell 55a in the fourth column, which is enclosed by a solid line in the drawing, to the output amplifier 58 in accordance with the read signal. The operation performed to output data from the sense amplifier 56 to the output amplifier 58 is referred to as a read operation.

The output amplifier 58 amplifies the amount of the transferred electrical charge to a predetermined value that is required for transfer, and then outputs the data to the CPU via the memory controller 30. Subsequently, the sense amplifier 56 returns the amplified electrical charge in a page 55b in the sixth row to the original cell 55a in the memory bank 55. This operation is referred to as a precharge operation. Therefore, the amount of electrical charge in the eight cells 55a in the page 55b (in the sixth row in FIG. 1), from which data has been read, is restored to the original state (fully charged state).

The above operations are the same as with common SDRAMs. The SDRAM according to the present embodiment is capable of additionally processing an activate operation for moving an electrical charge from a cell 55a to the sense amplifier 56 or a precharge operation for accumulating an electrical charge in a cell 55a from the sense amplifier 56 and a read/write operation for the sense amplifier 56 in relation to the outside of the SDRAM while using a single clock of the synchronizing clock signal for synchronization timing. As regards an operation that is performed with a single clock of the synchronizing clock signal in accordance with the address of data retained in the sense amplifier 56, the SDRAM according to the present embodiment performs a precharge operation for accumulating an electrical charge in a cell 55a from the sense amplifier 56 prior to an activate operation for moving an electrical charge from a cell 55a to the sense amplifier 56.

The above extended SDRAM operations will now be described in detail. In the SDRAM according to the present embodiment, four different extended complex operations can be performed within a single clock: activate/read operation ("A+R"), activate/write operation ("A+W"), precharge/activate/read operation ("P+A+R"), and precharge/activate/write operation ("P+A+W"). In the activate/read operation ("A+R"), a read operation ("R") is performed subsequently to an activate operation ("A"). In the activate/write operation ("A+W"), a write operation ("W") is performed subsequently to an activate operation ("A"). In the precharge/activate/read operation ("P+A+R") or precharge/activate/write operation ("P+A+W"), which is performed within a single clock, a precharge operation ("P") for accumulating an electrical charge in a cell 55a from the sense amplifier 56 precedes the above-mentioned complex operation (activate/read operation or activate/write operation). The SDRAM according to the present embodiment is not limited to the above four different extended complex operations. Various other complex operations, which are based on different combinations, can also be performed.

For the above extended SDRAM operations, commands are issued in accordance with a signal/command correspondence table in FIG. 2. Signal/command combinations are not limited to those indicate in FIG. 2. Various other combinations may be used for command issuance. Commands can be specified not only by using existing signal combinations but also by using newly added signals. It should be noted that the use of a bar symbol is omitted for the sake of brevity.

As indicated in FIG. 2, the MODE signal and EXT signal basically enable the commands for the above-mentioned four extended complex operations. More specifically, when the EXT and MODE signals are both Low ("L"), either a precharge/activate/read operation ("P+A+R") or precharge/activate/write operation ("P+A+W"), in which a precharge operation ("P") for accumulating an electrical charge in a cell 55a from the sense amplifier 56 precedes the other operations within a single clock, is performed. If the WE (write enable) signal is High ("H") in the above instance, the precharge/activate/read operation ("P+A+R") is performed. If, on the other hand, the WE (write enable) signal is Low ("L"), the precharge/activate/write operation ("P+A+W") is performed.

The remaining two extended complex operations, that is to say, an activate/read operation ("A+R") in which a read operation ("R") is performed subsequently to an activate operation ("A") and an activate/write operation ("A+W") in which a write operation ("W") is performed subsequently to an activate operation ("A"), are performed when the EXT signal is Low ("L") and the MODE signal is High ("H"). In this instance, the difference between the activate/read operation ("A+R") and activate/write operation ("A+W") depends on the WE (write enable) signal. If the WE (write enable) signal is High ("H"), the activate/read operation ("A+R") is performed. If, on the other hand, the WE (write enable) signal is Low ("L"), the activate/write operation ("A+W") is performed.

The other operations, that is to say, the basic SDRAM operations, are performed when the EXT signal is High ("H"), and various commands are specified by a combination of a CS (chip select) signal, RAS (row address strobe) signal, CAS (column address strobe) signal, and WE (write enable) signal. More specifically, when the CS (chip select) signal is Low ("L"), the memory unit 31 is selected. When the CS signal is High ("H"), no operation is performed (DESL).

The commands for the above activate operation "A", read operation "R", and precharge operation "P" are formed in accordance with a combination of the RAS (row address strobe), CAS (column address strobe), and WE (write enable) signals when the CS (chip select) signal is Low "L". More specifically, when the RAS signal is Low "L", the CAS signal is High "H", and the WE signal is High "H", an activate operation command (ACT) is formed. When the RAS signal is High "H", the CAS signal is Low "L", and the WE signal is High "H", a read operation command (READ) is formed. When the RAS signal is High "H", the CAS signal is Low "L", and the WE signal is Low "L", a write operation command (WRITE) is formed. When the RAS signal is Low "L", the CAS signal is High "H", and the WE signal is Low "L", a precharge operation command (PRE) or all-bank precharge operation command (PALL) is formed.

A no-instruction command (NOP) is formed when the CS (chip select) signal is Low "L", the RAS signal is High "H", the CAS signal is High "H", and the WE signal is High "H". A refresh command (REF), which sufficiently charge memory cell data, is formed when the CS (chip select) signal is Low "L", the RAS signal is Low "L", the CAS signal is Low "L", and the WE signal is High "H". A mode set command (MRS) is formed when the CS (chip select) signal is Low "L", the RAS signal is Low "L", the CAS signal is Low "L", and the WE signal is Low "L". A burst stop command (BST) is formed when the CS (chip select) signal is Low "L", the RAS signal is High "H", the CAS signal is High "H", and the WE signal is Low "L".

Signal/command combinations are not limited to those indicated in FIG. 2. Various other combinations may be used to specify a command. Although four different extended complex operations (precharge/activate/read operation ("P+A+R"), precharge/activate/write operation ("P+A+W"), activate/read operation ("A+R"), and activate/write operation ("A+W")) have been described, many other extended complex operations can be performed by using a plurality of bits for MODE selection.

The operations performed by the SDRAM according to the present embodiment will now be described in detail with reference to FIGS. 3 and 4. FIG. 3 illustrate the performance that is delivered when a low-frequency synchronizing clock is given. FIG. 3A is a timing diagram illustrating a read operation that a conventional DRAM (comparison example) performs at the maximum operating frequency (Fmax). FIG. 3B is a timing diagram illustrating a read operation that the conventional DRAM performs at half the maximum operating frequency (Fmax/2) FIG. 3C is a timing diagram illustrating the extended complex operations that are performed by the SDRAM according to the present embodiment. In the figures, the symbols "A," "R," and "P" represent an activate operation, read operation, and precharge operation, respectively.

When synchronism is achieved at the maximum operating frequency (Fmax) of a conventional DRAM (comparison example) as indicated in FIG. 3A, a total of three clocks are required before data output (gray area in the figure) because the activate operation ("A"), read operation ("R"), and precharge operation ("P") are performed on respective clocks. FIG. 3A shows that data is output on the third clock, which is a precharge clock. The timing diagram in FIG. 3B illustrates a case where the same DRAM operates at half the maximum operating frequency (Fmax/2). The DRAM is of synchronous type. Therefore, even if the length of the clock period becomes twofold, a total of three clocks are still required because the activate operation ("A"), read operation ("R"), and precharge operation ("P") are performed on respective clocks. Since the period of each clock is twofold, data output occurs on the fifth and sixth clocks at the maximum operating frequency (Fmax). In this instance, each operation is easily processed. However, the time required for each operation is increased twofold because control is exercised so as to achieve synchronization on a clock.

In FIG. 3C, an activate/read operation ("A+R"), which is a combination of an activate operation "A" and read operation "R", is performed. The resulting data output occurs one clock earlier than in the case indicated in (B). As described earlier, the activate operation "A" and read operation "R" are organized so that processing is completed within a single clock at the maximum operating frequency (Fmax). At half the maximum operating frequency at which the period is increased twofold, therefore, two operations can be processed within one clock. Therefore, the activate/read operation ("A+R") is performed. As a result, a precharge operation "P" is performed on the second clock. It means that processing is performed one clock earlier than in the case indicated in (B). When the activate/read operation ("A+R"), which is an extended complex operation, is used, a high-speed process is performed overall so as to improve the memory performance.

The low power consumption of the SDRAM according to the present embodiment will now be described with reference to FIG. 4. FIG. 4A is a timing diagram illustrating an operation of the SDRAM as an example of a conventional DRAM. In this example, the SDRAM operates like an SRAM (Static Random Access Memory) to perform an activate operation, read operation, and precharge operation within a single clock. In this example of a conventional DRAM, an activate operation, read operation, and precharge operation (three operations ("A+R+P")) are performed on every clock. Data is also output on every clock. For the activate operation ("A") and precharge operation ("P"), the sense amplifier corresponding to each memory bank is operated for amplification purposes. Therefore, the resulting power consumption is greater than for a read operation and write operation. When, for instance, the activate operation, read operation, and precharge operation are performed within a single clock and this sequence is performed five times in succession, as indicated in FIG. 4A, each of the activate operation, read operation, and precharge operation is performed five times. It means that the power consumption is increased accordingly.

As regards the SDRAM according to the present embodiment, if the data (cell) to be read in compliance with a subsequent instruction is included in a row address (page) that is read by an activate operation for the purpose of reading a specific cell during a read operation, an alternative instruction format in which the activate operation and precharge operation are properly omitted can be used. In the example shown in FIG. 4B, instructions are issued to perform an activate/read operation ("A+R") on the first clock, perform a read operation ("R") on the second and third clocks, perform a precharge/activate/read operation ("P+A+R") on the fourth clock, and perform a read operation ("R") on the fifth clock. A read operation is included in all the above-mentioned operations. Therefore, data is also output on every clock. In the example shown in FIG. 4B, the address (page) for a data read remains unchanged during the first three clocks. The precharge operation and activate operation can be omitted accordingly. As regards a command for the fourth clock, a precharge operation ("P") for accumulating an electrical charge in a cell from the sense amplifier precedes an activate operation ("A") for moving an electrical charge from a cell to the sense amplifier. The precharge/activate/read operation should be specified when the row address (page) changes. If, on the contrary, the row address of neighboring data remains unchanged for a read, only a read operation ("R"), which is low in power consumption, should be specified. For a 5-clock data read in the example shown in FIG. 4B, an activate operation is performed two times in total; a read operation is performed five times in total; and a precharge operation is performed once. When compared to the operations indicated in FIG. 4A, the power consumption is reduced because the number of activate operations is smaller by 3 and the number of precharge operations is smaller by 4. The activate and precharge operations basically consume a large amount of power. Therefore, when the activate and precharge operations are reduced in number, the power consumption greatly decreases.

When the employed control method does not perform a precharge operation each time as described above, data input/output is usually accomplished by issuing the command for an activate/read operation ("A+R"). Then, the page remains active after command issuance. Therefore, if the page to be accessed remains unchanged, a simple read operation would suffice. If, on the other hand, a different page is to be accessed, a precharge/activate/read operation ("P+A+R") should be performed in an indicated sequence within one clock. Particularly when a precharge operation ("P"), which accumulates an electrical charge in a cell from the sense amplifier, precedes an activate operation ("A"), which moves an electrical charge from a cell to the sense amplifier, the latency remains the same as in the use of a conventional SRAM-like DRAM while unnecessary activate operations and precharge operations are avoided. As a result, the power consumption is reduced.

Figure 6:
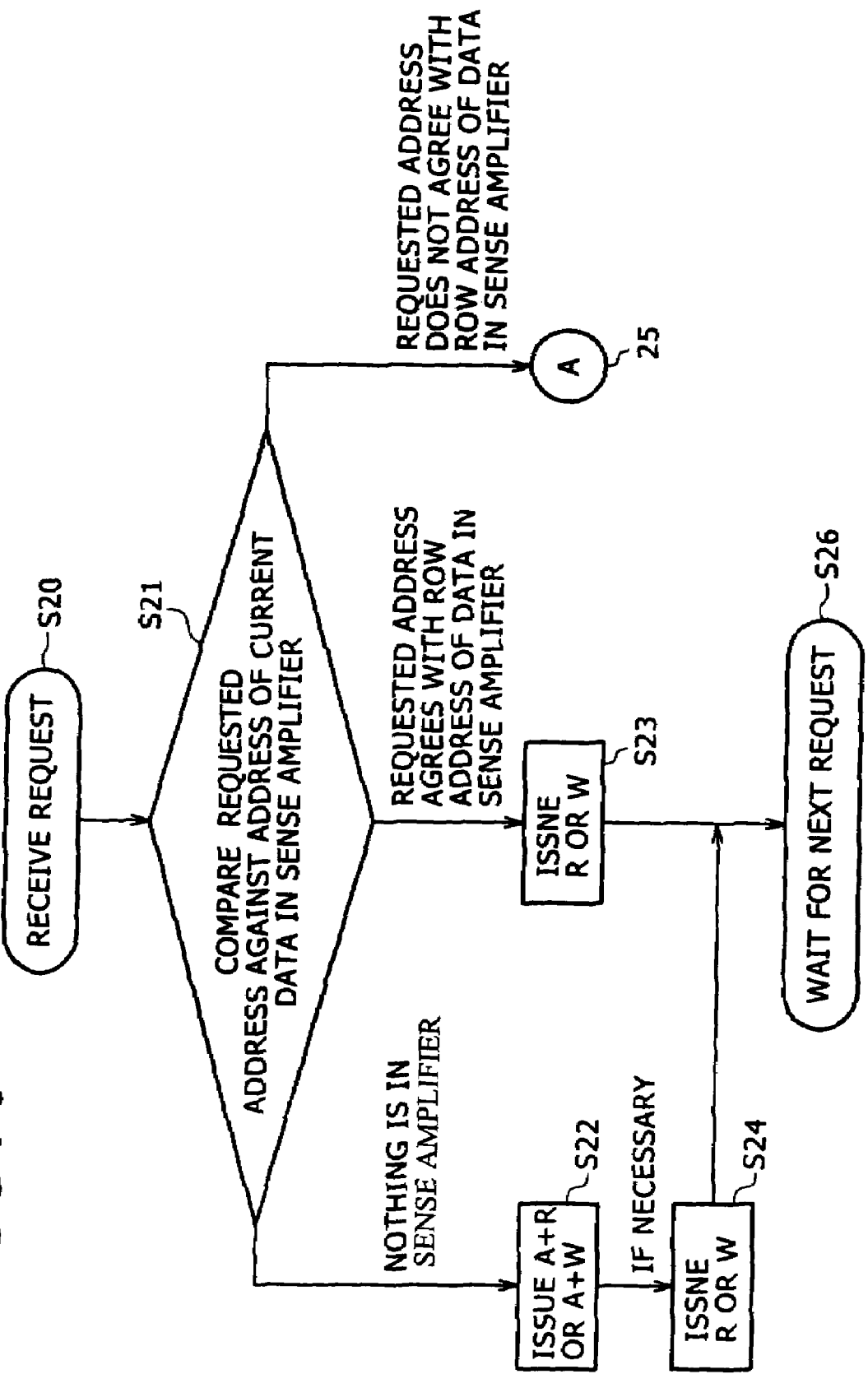
FIG. 6 is a flowchart illustrating another operation that is performed by an SDRAM according to one embodiment of the present invention.

Another control method for use in the SDRAM according to the present embodiment will now be described with reference to FIGS. 5 to 7. FIG. 5 is a flowchart for comparing a requested address against a sense amplifier data address and issuing a complex operation command. The process indicated in the flowchart is performed by a memory controller or other similar control device. However, if the memory is a part of a microcomputer, the process is performed by a peripheral memory control circuit.

First of all, step S10 is performed to receive a request from a CPU or other similar computation device. This request is, for instance, a data read or data write request. It specifies a predefined memory cell address and enters a memory controller or other similar control device. Next, step S11 is performed to compare the address of a cell related to the request against the address of the current data in the SDRAM sense amplifier. The result of this comparison can be classified into three types, which are described below.

Firstly, if no data is contained in the sense amplifier, the flow proceeds to step S12. In step S12, the command for an activate/read operation ("A+R") or the command for an activate/write operation ("A+W") is issued to perform a data input/output operation. After command issuance, the flow proceeds to step S15 to wait for the next request. Secondly, if the row address of the data in the sense amplifier agrees with the row address of the cell related to the request, the flow proceeds to step S13. In step S13, the command for a read operation ("R") or the command for a write operation ("W") is issued. When the row address of the data in the sense amplifier agrees with the row address of a cell related to the request, it is not necessary to perform an activate operation ("A") for moving an electrical charge from a cell to the sense amplifier or a precharge operation ("P") for accumulating an electrical charge from the sense amplifier in a cell. Therefore, the process can be continued simply by issuing the command for a read operation ("R") or the command for a write operation ("W"). When the process is continued by using a simple command for a read operation ("R") or write operation ("W"), unnecessary activate operations and precharge operations, which are high in power consumption, can be avoided. After command issuance, the flow proceeds to step S15 to wait for the next request.

Thirdly, if the row address of the data contained in the sense amplifier does not agree with the row address of a cell related to the request, the flow proceeds to step S14. In step S14, the command for a precharge/activate/read operation ("P+A+R") or the command for precharge/activate/write operation ("P+A+W") is issued. When the sense amplifier row address does not agree with the row address of a cell related to the request, data replacement is needed. For such data replacement, it is necessary to write the preceding data and read up to the sense amplifier. Therefore, the precharge operation ("P") for accumulating an electrical charge in the cell from the sense amplifier precedes the activate operation ("A") for moving an electrical charge from the cell to the sense amplifier. After the activate operation ("A"), the command for a read operation ("R") or write operation ("W") is issued to read or write the data at an address related to the request. After command issuance, the flow proceeds to step S15 to wait for the next request.

When the process is performed in accordance with the above flowchart, it is possible to avoid unnecessary activate operations and precharge operations and reduce the power consumption without changing, for instance, the latency. The process shown in FIG. 5 is performed by a program that can constantly issue the commands (six commands) for a precharge/activate/read operation ("P+A+R"), precharge/activate/write operation ("P+A+W"), activate/read operation ("A+R"), activate/write operation ("A+W"), read operation ("R"), and write operation ("W").

Another control method for use in the SDRAM according to the present embodiment will now be described with reference to FIGS. 6 and 7. FIGS. 6 and 7 are flowcharts illustrating a typical process that considers a situation where the frequency is not lowered to let three operations, such as those included in a precharge/activate/read operation ("P+A+R"), be performed within a single clock. It should be noted that A in FIG. 7 corresponds to A (step S25) in FIG. 6. The process indicated in the flowcharts is performed by a memory controller or other similar control device. However, if the memory is a part of a microcomputer, the process is performed by a peripheral memory control circuit.

First of all, step S20 is performed to receive a request from a CPU or other similar computation device. This request is, for instance, a data read or data write request. It specifies a predefined memory cell address and enters a memory controller or other similar control device. Next, step S21 is performed to compare the address of a cell related to the request against the address of the current data in the SDRAM sense amplifier. As is the case with the flowchart in FIG. 5, the result of this comparison can be classified into three types, which are described below.

Firstly, if no data is contained in the sense amplifier, the flow proceeds to step S22. In step S22, the command for an activate/read operation ("A+R") or the command for an activate/write operation ("A+W") is issued to perform a data input/output operation. Next, the flow proceeds to step S24. In step S24, the command for a read operation ("R") or write operation ("W") is issued if necessary. After command issuance, the flow proceeds to step S26 to wait for the next request.

Secondly, if the row address of the data in the sense amplifier agrees with the row address of a cell related to the request, the flow proceeds to step S23. In step S23, the command for a read operation ("R") or the command for a write operation ("W") is issued. When the row address of the data in the sense amplifier agrees with the row address of the cell related to the request, it is not necessary to perform an activate operation ("A") for moving an electrical charge from a cell to the sense amplifier or a precharge operation ("P") for accumulating an electrical charge in a cell from the sense amplifier. Therefore, the process can be continued simply by issuing the command for a read operation ("R") or the command for a write operation ("W"). When the process is continued by using a simple command for a read operation ("R") or write operation ("W"), unnecessary activate operations and precharge operations, which are relatively high in power consumption, can be avoided. After command issuance, the flow proceeds to step S26 to wait for the next request.

Figure 7:
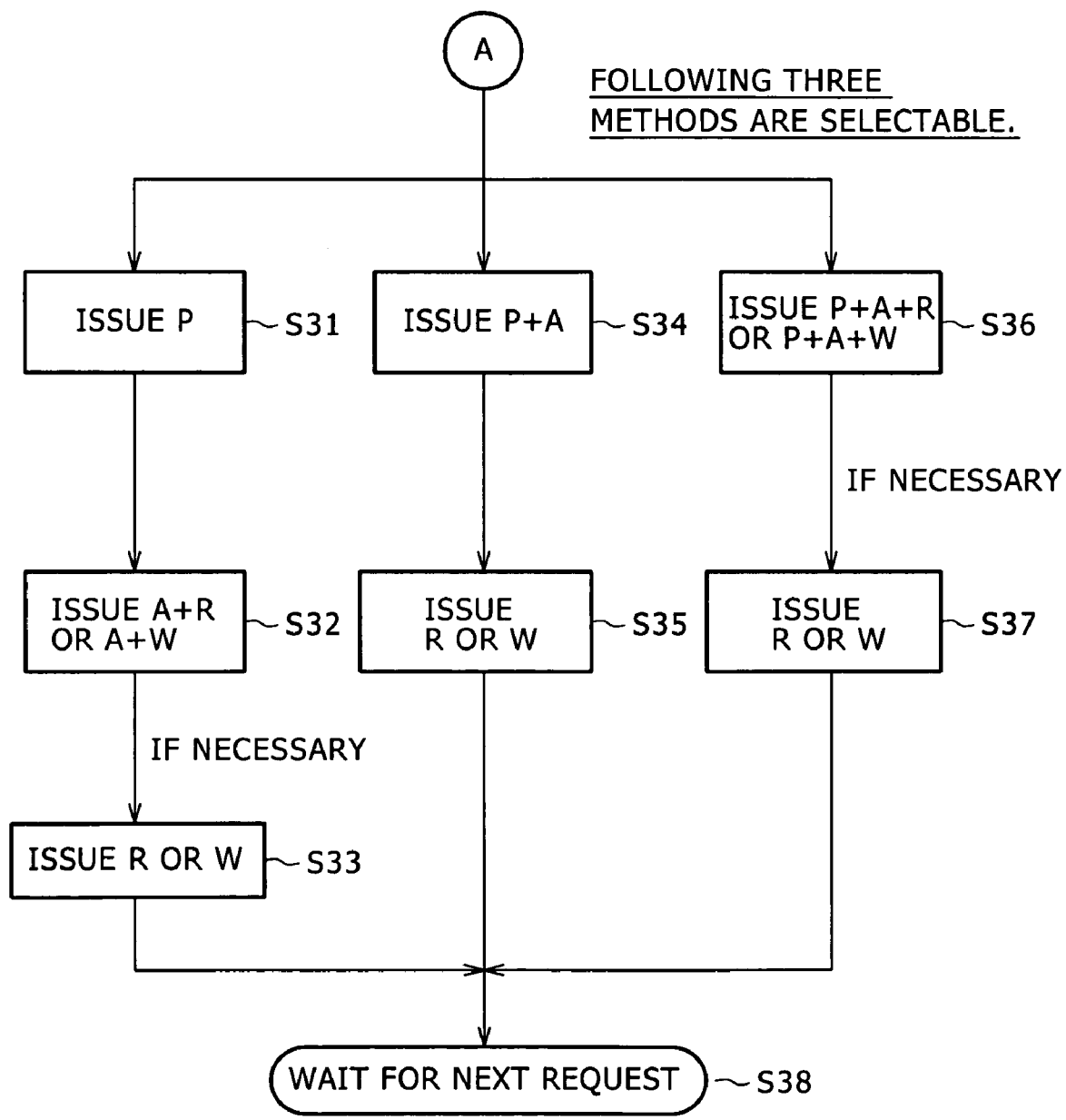
FIG. 7 is a flowchart illustrating another operation that is performed by an SDRAM according to one embodiment of the present invention. This flowchart is a continuation of A in FIG. 6.

Thirdly, if the row address of the data contained in the sense amplifier does not agree with the row address of a cell related to the request, the flow proceeds to step S25 and continues with the flowchart in FIG. 7. In the flowchart shown in FIG. 7, three different processing methods are selectable. In accordance with a processing method selection, the flow proceeds to step S31 in which the command for a precharge operation ("P") is issued, step S34 in which the command for a precharge/activate operation ("P+A") is issued, or step S36 in which the command for a precharge/activate/read operation ("P+A+R") or precharge/activate/write operation ("P+A+W") is issued. The selection can be made in accordance with the relationship between the clock frequency and the period of time required for an operation. For example, control can be exercised so that the flow proceeds to step S36 when a precharge operation, activate operation and read operation can be processed within a single clock or proceeds to step S31 or S34 when the three operations cannot be processed within a single clock.

When the flow proceeds to step S31, the command for a precharge operation ("P") is issued, and then the command for an activate/read operation ("A+R") or activate/write operation ("A+W") is issued (step S32). When steps S31 and S32 are both completed, the precharge operation, activate operation, and read or write operation are performed. Next, the flow proceeds to step S33. In step S33, the command for a read operation ("R") or write operation ("W") is issued if necessary. After command issuance, the flow proceeds to step S38 to wait for the next request.

When the flow proceeds to step S34, the command for a precharge/activate operation ("P+A") is issued. Next, step S35 is performed to issue the command for a read operation ("R") or write operation ("W"). After command issuance, the flow proceeds to step S38 to wait for the next request.

When the flow proceeds to step S36, the command for a precharge/activate/read operation ("P+A+R") or precharge/activate/write operation ("P+A+W") is issued. Next, step S37 is performed to issue the command for a read operation ("R") or write operation ("W") if necessary. After command issuance, the flow proceeds to step S38 to wait for the next request.

When the process is performed in accordance with the above flowcharts, it is possible to avoid unnecessary activate operations and precharge operations and reduce the power consumption without changing, for instance, the latency. Further, high processing efficiency can be achieved even when operations are performed with a low-frequency clock signal that cannot process a precharge operation, activate operation and read operation within a single clock.

A PDA (Personal Digital Assistance) in which the SDRAM according to the present invention is incorporated will now be described with reference to FIG. 8. The PDA includes a PDA core section 60, which is to be connected to an LCD (Liquid Crystal Display), touch panel, or the like (not shown). The PDA core section 60 includes a CPU 61 and a coprocessor 62, which perform required information processing procedures. The CPU 61 is connected to a bus line 66. The bus line 66 is connected, for instance, to a bus bridge 67 for connecting to a low-speed circuit section, a graphic engine 63 for drawing a picture at a high speed, a camera interface 65 for connecting to an image pickup camera, and an LCD controller 64 for exchanging signals with the LCD.

The bus bridge 67 is connected, for instance, to a USB (Universal Serial Bus) controller 81, an I/O bus 82, a touch panel interface 83, and a keyboard/jog dial/LED interface 84. The bus bridge 67 is also connected to a frequency control section 76, which outputs a clock signal CLKv and the frequency information Infq about the clock signal CLKv.

The aforementioned bus line 66 is also connected to an SDRAM 71, which is an information storage device, a DRAM controller 72, and an external memory controller 73. The DRAM controller 72 is a circuit section for transmitting a control signal to the SDRAM 71. The SDRAM according to the present embodiment can perform, for instance, four different extended complex operations within a single clock: activate/read operation ("A+R"), activate/write operation ("A+W"), precharge/activate/read operation ("P+A+R"), and precharge/activate/write operation ("P+A+W"). In the latter two operations, a precharge operation ("P"), which accumulates an electrical charge in a cell from the sense amplifier, precedes the former two operations. The commands for the above operations are transmitted from the DRAM controller 72 to the SDRAM 71, which is an information storage device. Further, the frequency information Infq about the clock signal CLKv, which can be varied by the frequency control section 76, is supplied to the DRAM controller 72. The DRAM controller 72 carries out a decoding process and other computation processes with the frequency information Infq for the purpose of performing an optimum process on the SDRAM 71 even when the frequency of the clock signal CLKv changes. When the frequency of the clock signal CLKv changes, a memory system 41, which includes the SDRAM 71 and DRAM controller 72, can perform a process in accordance with the frequency information Infq to attain high processing speed without having to wait for an extra period of time.

In addition to the memory system 41, the external memory controller 73 may be configured to issue the commands for performing the extended complex operations so that an external SDRAM 75 performs complex operations. For example, the external SDRAM 75 may perform four different extended complex operations within a single clock: activate/read operation ("A+R"), activate/write operation ("A+W"), precharge/activate/read operation ("P+A+R"), and precharge/activate/write operation ("P +A+W"). In the latter two operations, a precharge operation ("P"), which accumulates an electrical charge in a cell from the sense amplifier, precedes the former two operations. Further, the frequency information Infq about the variable clock signal CLKv can be supplied to the external memory controller 73. The external memory controller 73 is a circuit for transmitting control signals to a ROM 74 and the external SDRAM 75, which are connected to an external memory bus. The external memory controller 73 also carries out a decoding process and other computation processes with the frequency information Infq for the purpose of performing an optimum process on the ROM 74 and external SDRAM 75 without having to wait for an extra period of time when the frequency of the clock signal CLKv changes. A control section 42, which includes the external memory controller 73, and a memory section 43, which includes the ROM 74 and external SDRAM 75, constitutes a memory system. This memory system performs a high-speed process as is the case with the aforementioned memory system 41. The memories connected to the external memory controller 73 are not limited to the ROM 74 and external SDRAM 75. Alternatively, the other memories and signal processing devices may be connected to the external memory controller 73. Further, the same frequency information Infq may be supplied to the external memory controller 73 and DRAM controller 72. When different clock signals are used, different sets of the frequency information Infq may be used.

Figure 8:
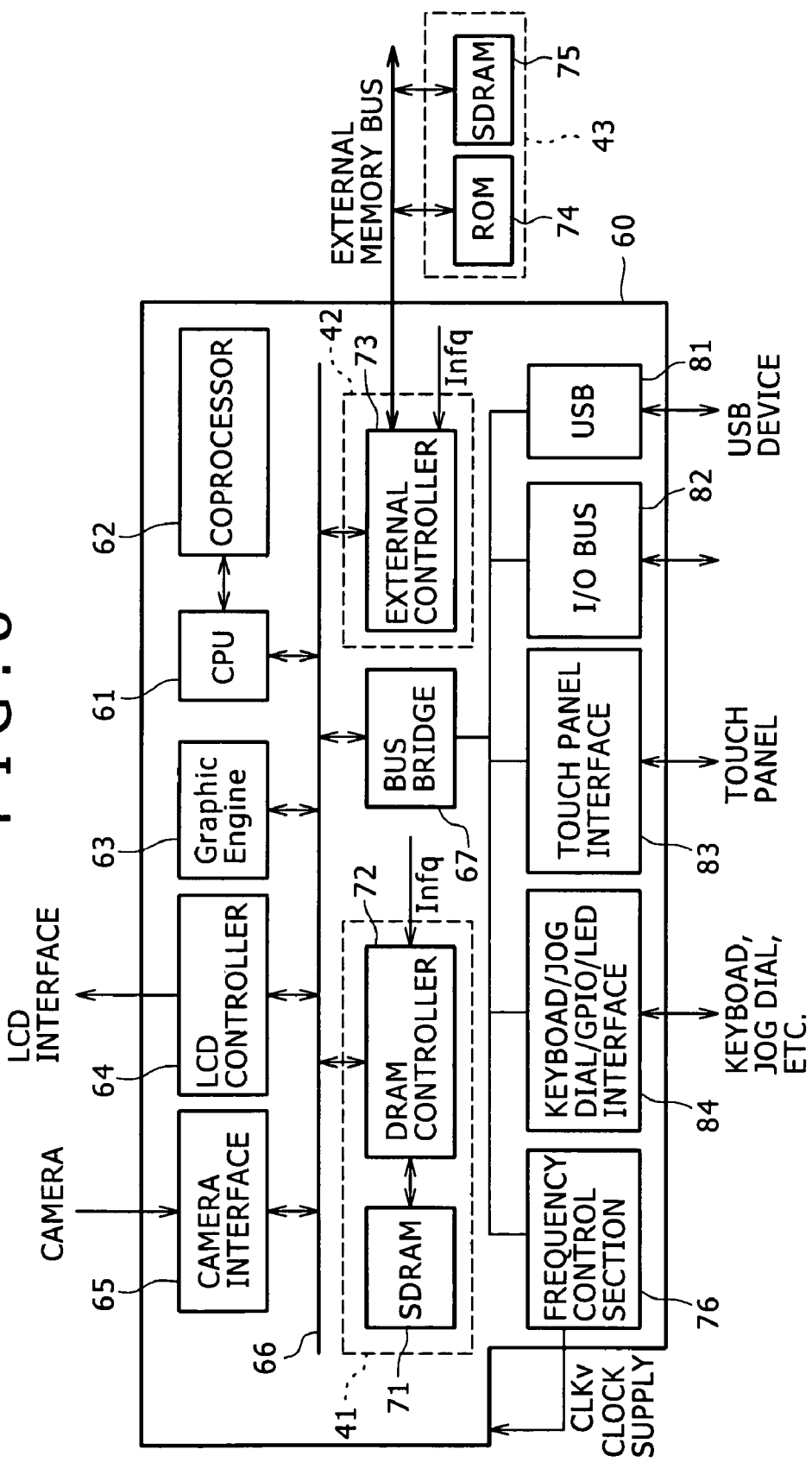
FIG. 8 is a block diagram illustrating an example in which a memory controller and an SDRAM according to one embodiment of the present invention are incorporated in a PDA.

Although FIG. 8 illustrates a typical PDA, the SDRAM according to the present embodiment can also be applied to a personal computer, cellular phone, or other electronic device. Since the SDRAM according to the present embodiment is low in power consumption, it is ideally suited for use in a device that involves, for instance, a sleep mode or standby state.

The aforementioned series of processes can be performed by hardware. However, they can also be performed by software. As regards the steps for writing the program, the processes to are chronologically performed in a specified sequence include not only chronological processes but also processes that are performed in a parallel manner or individually.

The above embodiment has been described on the assumption that the memory controller or other storage device controller is mainly provided with a mechanism for reading the frequency information Infq and adjusting the control function. However, the present invention is not limited to the use of such a scheme. For example, the present invention is applicable to a case where a variable clock signal is supplied to a signal processing device or circuit. The employed circuitry may perform a computation process on the frequency information about the variable clock signal to calculate the required wait time and perform an optimum information process.

The electronic device in which the present embodiment is to be incorporated is not limited to a PDA and personal computer. The present embodiment can also be incorporated in a printer, fax machine, personal computer peripheral device, cellular phone and other telephones, television receiver, image display device, communication apparatus, camera, radio, VCR, digital home appliance, lighting apparatus, game machine, radio-controlled model car and other toys, motor-driven tool, medical instrument, measuring instrument, on-vehicle device, office equipment, health care/beauty instrument, electronically-controlled robot, wearable electronic device, various motor-driven devices, vehicle, ship, airplane, and other transport machines, home/industrial power generator, and various other electronic devices for the other uses.

INDUSTRIAL APPLICABILITY

The information storage device according to the present invention can newly set a command for an extended complex operation in which two or three operations are performed, and process the extended complex operation while using substantially the same clock of a synchronizing clock signal for synchronization timing. As a result, high data processing efficiency is achieved. Further, even when a plurality of operations is performed, processing is performed so that all three basic operations are not performed on every clock. Consequently, the operations can be partly omitted to reduce the power consumption.

The invention claimed is:

1. An information storage device comprising:
   a plurality of memory cells configured to store data by accumulating an electrical charge; and
   an amplifier configured to amplify the electrical charge of the memory cells,
   wherein a synchronizing clock signal is used for input/output timing of the data; and
   wherein an electrical charge removal operation for moving the electrical charge of said memory cells to said amplifier or an electrical charge accumulation operation for acquiring the electrical charge from said amplifier and accumulating the electrical charge of said memory cells and an input/output operation for said amplifier in relation to the outside of the information storage device are processed while using a single clock of said synchronizing clock signal for synchronization timing,
   wherein said operations begin when a request signal is received; and wherein, when said request signal is received, the address of a memory cell related to the request signal is compared against the address of data temporarily retained in said amplifier at the time of request signal reception.

2. The information storage device according to claim 1, wherein the frequency of said synchronizing clock signal is variable.

3. An information storage device comprising:
   a plurality of memory cells configured to store data by accumulating an electrical charge;
   an amplifier configured to amplify the electrical charge of the memory cells; and
   a comparator configured to compare a requested memory cell address against data temporarily retained in said amplifier,
   wherein, if the requested memory cell address does not agree with the address of the data in said amplifier, instructions are issued for sequentially processing an electrical charge accumulation operation for acquiring the electrical charge from said amplifier and accumulating the electrical charge of said memory cells, an input/output operation for said amplifier in relation to the outside of the information storage device, and an electrical charge removal operation for moving the electrical charge of said memory cells to said amplifier in order named while using a single clock for synchronization timing.

4. The information storage device according to claim 3, wherein, when nothing is retained by said amplifier, said comparator issues instructions for sequentially processing the electrical charge removal operation for moving the electrical charge from said memory cells to said amplifier and the input/output operation for said amplifier in relation to the outside of the information storage device in order named while using a single clock for synchronization timing.

5. The information storage device according to claim 3, wherein, when the requested memory cell address agrees with the address of the data in said amplifier, said comparator issues instructions for processing the input/output operation for said amplifier in relation to the outside of the information storage device with clock synchronization achieved.

6. The information storage device according to claim 3, wherein the frequency of said synchronizing clock signal is variable.

7. An information storage device comprising:
   a plurality of memory cells configured to store data by accumulating an electrical charge;
   an amplifier configured to amplify the electrical charge of the memory cells; and
   a comparator configured to compare a requested memory cell address against data in said amplifier, and configured to perform, on every single clock of a synchronizing clock signal, an electrical charge removal operation for moving the electrical charge of said memory cells to said amplifier, an electrical charge accumulation operation for acquiring the electrical charge from said amplifier and accumulating the electrical charge of the memory cells, and an input/output operation for said amplifier in relation to the outside of the information storage device,
   wherein, if the requested memory cell address does not agree with the address of the data in said amplifier, instructions are issued for sequentially processing the electrical charge accumulation operation for acquiring the electrical charge from said amplifier and accumulating the electrical charge of said memory cells, the input/output operation for said amplifier in relation to the outside of the information storage device, and the electrical charge removal operation for moving the electrical charge of said memory cells to said amplifier in order named while using a single clock of said synchronizing clock signal for synchronization timing.

8. The information storage device according to claim 7, wherein the frequency of said synchronizing clock signal is variable.

9. The information storage device according to claim 7, wherein, in accordance with the frequency of said synchronizing clock signal, said comparator issues instructions for sequentially processing the electrical charge accumulation operation for acquiring the electrical charge from said amplifier and accumulating the electrical charge in said memory cells and the input/output operation for said amplifier in relation to the outside of the information storage device in order named, and for sequentially processing the input/output operation for said amplifier in relation to the outside of the information storage device and the electrical charge accumulation operation for acquiring the electrical charge from said amplifier and accumulating the electrical charge in said memory cells in order named.

10. An information storage method comprising:
    comparing, when a request signal is received, the memory cell address designated by the request signal against the address of data temporarily retained in an amplifier; and selectively performing, in accordance with the comparison result, an electrical charge removal operation for moving an electrical charge from said memory cells to said amplifier, an electrical charge accumulation operation for acquiring an electrical charge from said amplifier and accumulating the electrical charge in said memory cells, and an input/output operation for said amplifier in relation to the outside of the information storage device.

11. The information storage method according to claim 10, wherein said selectively performing said operations is processed while using substantially the same clock of a synchronizing clock signal for synchronization timing.

12. The information storage method according to claim 10, wherein the frequency of said synchronizing clock signal is variable.

13. The information storage method according to claim 10, wherein said selectively performed operations comprise a process that is a combination of two or more operations.

14. An information storage program for executing an information storage method comprising:

comparing, when a request signal is received, the memory cell address designated by the request signal against the address of data temporarily retained in an amplifier; and selectively performing, in accordance with the comparison result, an electrical charge removal operation for moving an electrical charge from said memory cells to said amplifier, an electrical charge accumulation operation for acquiring an electrical charge from said amplifier and accumulating the electrical charge in said memory cells, and an input/output operation for said amplifier in relation to the outside of the information storage device.

15. The information storage program according to claim 14, wherein said selectively performing said operations is processed while using substantially the same clock of a synchronizing clock signal for synchronization timing.

16. The information storage program according to claim 14, wherein said selectively performed operations comprise a process that is a combination of two or more operations.

* * * * *